(12) United States Patent
Hwang et al.

(10) Patent No.: US 9,985,208 B2
(45) Date of Patent: May 29, 2018

(54) METHOD FOR MANUFACTURING DISPLAY DEVICE USING UV CURABLE ADHESIVE AND DISPLAY DEVICE MANUFACTURED BY THE METHOD

(71) Applicant: Samsung Display Co., Ltd., Yongin (KR)

(72) Inventors: Hyeon Deuk Hwang, Cheonan-si (KR); Su Kyoung Kim, Cheonan-si (KR); So Yeon Joo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 14/727,087

(22) Filed: Jun. 1, 2015

(65) Prior Publication Data
US 2016/0197300 A1 Jul. 7, 2016

(30) Foreign Application Priority Data
Jan. 5, 2015 (KR) ........................ 10-2015-0000606

(51) Int. Cl.
*H01L 51/00* (2006.01)
*H01L 35/24* (2006.01)
(Continued)

(52) U.S. Cl.
CPC ............ *H01L 51/003* (2013.01); *H01L 24/75* (2013.01); *H01L 24/29* (2013.01); *H01L 24/32* (2013.01); *H01L 24/83* (2013.01); *H01L 2224/293* (2013.01); *H01L 2224/2929* (2013.01); *H01L 2224/32227* (2013.01); *H01L 2224/7531* (2013.01); *H01L 2224/83101* (2013.01);
(Continued)

(58) Field of Classification Search
CPC ......... H01L 2924/0002; H01L 2924/00; H01L 51/524; H01L 2251/5338; H01L 2924/14; H01L 51/003; H01L 51/5237
USPC ......... 522/8; 257/40, 783; 438/118–119, 26; 349/33; 313/504
See application file for complete search history.

(56) References Cited

U.S. PATENT DOCUMENTS

2008/0165139 A1* 7/2008 Hotelling ................ G06F 3/041
345/173
2009/0322214 A1* 12/2009 Lee ......................... H05B 33/04
313/504
(Continued)

FOREIGN PATENT DOCUMENTS

CN 102250578 A * 11/2011
JP 2013-080876 5/2013
(Continued)

*Primary Examiner* — Lex Malsawma
*Assistant Examiner* — Nduka Ojeh
(74) *Attorney, Agent, or Firm* — H.C. Park & Associates, PLC

(57) ABSTRACT

A method for manufacturing a display device, includes preparing a display panel including a base substrate, an encapsulation layer facing the base substrate, and an organic light emitting device formed between one surface of the base substrate and the encapsulation layer, attaching a support layer to the other surface of the base substrate through an adhesive layer, curing the adhesive layer through irradiation of UV light, and mounting a driving chip on one surface of the display panel. The adhesive layer includes an acryl-based compound, a UV curable compound, and a photoinitiator.

16 Claims, 14 Drawing Sheets

(51) Int. Cl.
*H01L 29/08* (2006.01)
*H01L 23/00* (2006.01)

(52) U.S. Cl.
CPC ............... *H01L 2224/83851* (2013.01); *H01L 2251/5338* (2013.01); *H01L 2924/14* (2013.01)

(56) References Cited

U.S. PATENT DOCUMENTS

| | | | |
|---|---|---|---|
| 2010/0061093 A1* | 3/2010 | Janssen | F21K 9/00 362/235 |
| 2010/0101856 A1* | 4/2010 | Yee | H01L 51/5237 174/544 |
| 2010/0261018 A1* | 10/2010 | Turshani | B32B 7/12 428/414 |
| 2011/0130065 A1* | 6/2011 | Andoh | H01J 9/20 445/24 |
| 2012/0327319 A1* | 12/2012 | Saitoh | G02F 1/1345 349/33 |
| 2013/0342925 A1* | 12/2013 | Lee | C09J 7/02 359/838 |
| 2014/0037952 A1* | 2/2014 | Shigetomi | C09J 133/08 428/355 AC |
| 2014/0255709 A1* | 9/2014 | Hasegawa | H05K 3/1208 428/457 |

FOREIGN PATENT DOCUMENTS

| | | |
|---|---|---|
| JP | 2014-084360 | 5/2014 |
| KR | 10-2012-0133848 | 12/2012 |
| KR | 10-2015-0004647 | 1/2015 |
| KR | 10-2015-0043078 | 4/2015 |
| KR | 10-2015-0051019 | 5/2015 |
| KR | 10-2015-0086969 | 7/2015 |
| KR | 10-2015-0087493 | 7/2015 |

* cited by examiner

METHOD FOR MANUFACTURING DISPLAY DEVICE USING UV CURABLE ADHESIVE AND DISPLAY DEVICE MANUFACTURED BY THE METHOD

CROSS REFERENCE TO RELATED APPLICATION

This application claims priority from and the benefit of Korean Patent Application No. 10-2015-0000606, filed on Jan. 5, 2015, which is hereby incorporated by reference for all purposes as if fully set forth herein.

BACKGROUND

Field

Exemplary embodiments relate to a method for manufacturing a display device and a display device manufactured by the method.

Discussion of the Background

Organic light emitting displays have recently been used in small-sized mobile devices, such as smartphones, and have also been applied to large-scale televisions having large-area screens.

An organic light emitting display device is a self-luminous display device that displays an image through organic light emitting diodes that emit light. In such an organic light emitting diode, holes and electrons, which are respectively generated by a first electrode and a second electrode, are injected into a light emitting layer that is positioned between the first electrode and the second electrode. Through combination of the holes and the electrons injected into the light emitting layer, excitons are created, and light is emitted by energy that is generated when the created excitons fall from an excited state to a ground state.

Recently, a flexible display device, which is thin and lightweight and has high portability, has been developed. The flexible display device is a display device that can maintain a flat shape or can be changed to a curved shape through a flexible substrate provided therein.

Accordingly, there is demand for a method of manufacturing a flexible display device that can have high resolution characteristics while using a flexible substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method for manufacturing a display device and a display device manufactured by the method, having high resolution characteristics.

Exemplary embodiments also provide a method for manufacturing a display device and a display device manufactured by the method, which can prevent thermal deformation during a process of manufacturing the display device.

Additional features of the invention will be set forth in the description which follows, and in part will be apparent from the description, or may be learned by practice of the invention.

An exemplary embodiment of the present invention discloses a method for manufacturing a display device, including: preparing a display panel including a base substrate, an encapsulation layer facing the base substrate, and an organic light emitting device formed between one surface of the base substrate and the encapsulation layer; attaching a support layer to the other surface of the base substrate through an adhesive layer; curing the adhesive layer through irradiation of UV light; and mounting a driving chip on one surface of the display panel. The adhesive layer includes an acryl-based compound, a UV curable compound, and a photoinitiator.

An exemplary embodiment also discloses a display device including a base substrate, an encapsulation layer facing the base substrate, an organic light emitting device interposed between one surface of the base substrate and the encapsulation layer, a support layer formed on the other surface of the base substrate, an adhesive layer interposed between the base substrate and the support layer, and a driving chip mounted on the base substrate. The adhesive layer includes an acryl-based compound, a UV-curable compound, and a photoinitiator.

It is to be understood that both the foregoing general description and the following detailed description are exemplary and explanatory and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the invention, and together with the description serve to explain the principles of the inventive concept.

DETAILED DESCRIPTION OF THE ILLUSTRATED EMBODIMENTS

Figure 1:
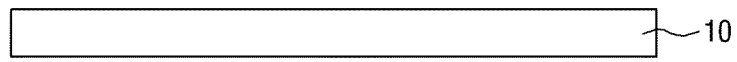
FIGS. 1, 2, 3, 4, 5, 6, 7, 8, 9, 10, 11, and 12 are cross-sectional views schematically explaining a method for manufacturing a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present invention will be described with reference to the accompanying drawings.

FIGS. 1 to 12 are cross-sectional views schematically explaining a method for manufacturing a display device according to an exemplary embodiment. Hereinafter, referring to FIGS. 1 to 12, a method for manufacturing a display device according to an exemplary embodiment will be described.

In general, the method for manufacturing a display device according to exemplary embodiment may include preparing a display panel including a base substrate 50, an encapsulation layer 200 facing the base substrate 50, and an organic light emitting device 100 formed between one surface of the base substrate 50 and the encapsulation layer 200. The method may further include attaching a support layer 500 to the other surface of the base substrate 50 through an adhesive layer 400, curing the adhesive layer 400 through irradiation using UV light, and mounting a driving chip 600 on one surface of the display panel.

Figure 2:

Preparing a display panel may include forming the base substrate 50 on a sacrificial substrate 10, as shown in FIG. 2. FIG. 1 shows sacrificial substrate 10 before base substrate 50 is disposed. The base substrate 50 may be formed of a flexible material. Thus, in an exemplary embodiment, the base substrate 50 may include polyimide (PI), but is not limited thereto. For example, the base substrate 50 may be made of a material having insulation and flexibility properties. By using an exemplary base substrate 50, a display device may have a flexible characteristic.

The thickness of the base substrate 50 may be in the range of 1 μm to 50 μm. The base substrate 50 may be attached to the sacrificial substrate 10 by coating resin compositions, which may additionally or alternatively be included in the base substrate 50, on the sacrificial substrate 10 and curing and drying the coated resin compositions.

The sacrificial substrate 10 may be a substrate formed of glass, and the resin compositions may be coated on the sacrificial substrate 10 using, for example, gravure roll coating, cast coating, spray coating, dip coating, die coating, or offset printing. A detailed explanation of these coating methods will be omitted.

Figure 3:
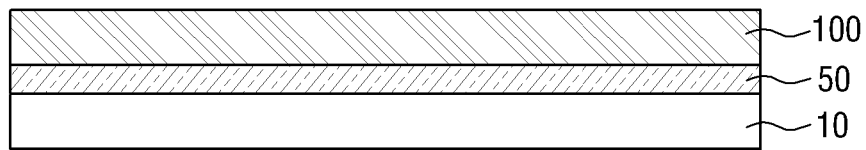

As shown in FIG. 3, a layer of the organic light emitting device 100 may be formed on the base substrate 50, which is formed on the sacrificial substrate 10. The organic light emitting device 100 will be described in detail later.

Figure 4:
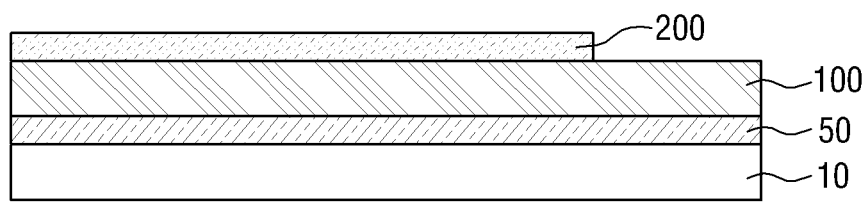

Next, as shown in FIG. 4, the organic light emitting device 100 may be interposed between the base substrate 50 and the encapsulation layer 200, thereby sealing the organic light emitting device 100. The encapsulation layer 200 prevents an inflow of moisture and gas from the external environment, protecting the organic light emitting device 100. The encapsulation layer 200 may be formed of an insulation material having high permeability and moisture resistance so as to prevent a loss of light permeating to the outside and to intercept the moisture and oxygen that permeate into the organic light emitting device 100.

As will be described in further detail, the encapsulation layer 200 may not be formed in a partial region of the display panel. That is, the display panel may include a display portion and a pad portion, and the encapsulation layer 200 may be formed on the display portion, but may not be formed on a part of the pad portion in order to expose the pad portion. Through this, signal wirings that extend from the organic light emitting device on the display panel may be electrically connected to the driving chip mounted on the pad portion.

Figure 5:
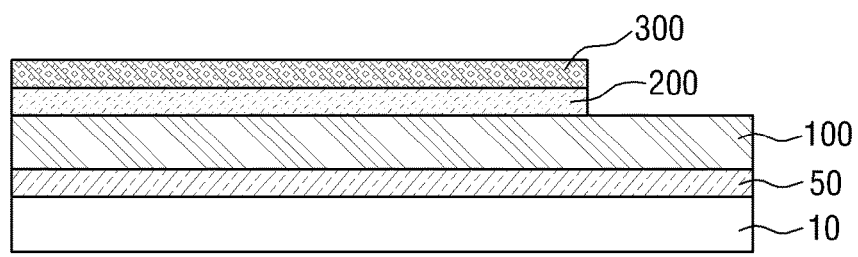

Next, as shown in FIG. 5, a polarizing plate 300 may be attached onto the encapsulation layer 200. The polarizing plate 300 may prevent reflection by an external light. The polarizing plate 300 may include a polyvinyl alcohol-based film on which iodic or dichroic dyes are disposed via a dying process and aligned. FIG. 5 illustrates that the polarizing plate 300 is formed after the encapsulation layer 200 is formed. However, exemplary embodiments are not limited thereto. For example, attachment of the polarizing plate 300 may be omitted or may be performed at a different time relative to the entire process.

Figure 6:
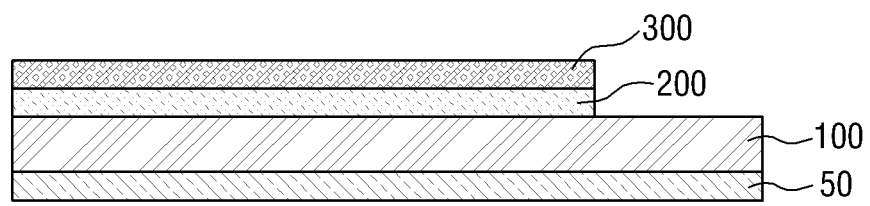

Next, as shown in FIG. 6, the sacrificial substrate 10 may be removed. The removal of the sacrificial substrate 10 may be performed by applying a constant peeling force between the sacrificial substrate 10 and the base substrate 50 or by weakening an adhesive force between the sacrificial substrate 10 and the base substrate 50.

Through the above-described processes of FIGS. 1 to 6, the display panel may be prepared.

Figure 7:
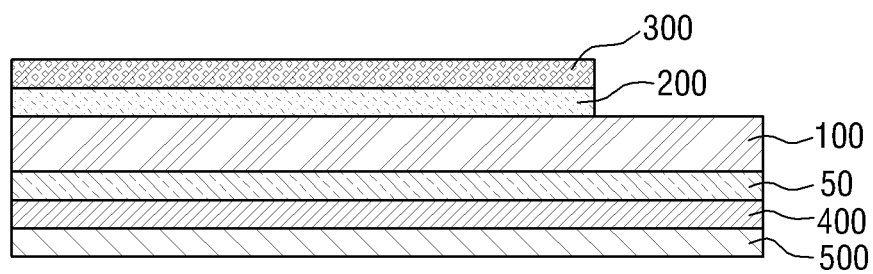

Next, as shown in FIG. 7, the support layer 500 may be attached to the base substrate 50. The attachment of support layer 500 may be performed when the adhesive layer 400 is interposed between the base substrate 50 and the support layer 500. That is, the organic light emitting device 100 may be formed on one surface of the base substrate 50, and the support layer 500 may be attached to the other surface of the base substrate 50 through the adhesive layer 400.

The support layer 500 may be formed of a material having insulation and flexibility characteristics. For example, the support layer 500 may be formed of polyethylene terephthalate (PET). The support layer 500 may increase durability by reducing deterioration due to the low thickness of the base substrate 50. The thickness of the support layer 500 may be in the range of 100 μm to 250 μm, but is not limited thereto.

Figure 8:
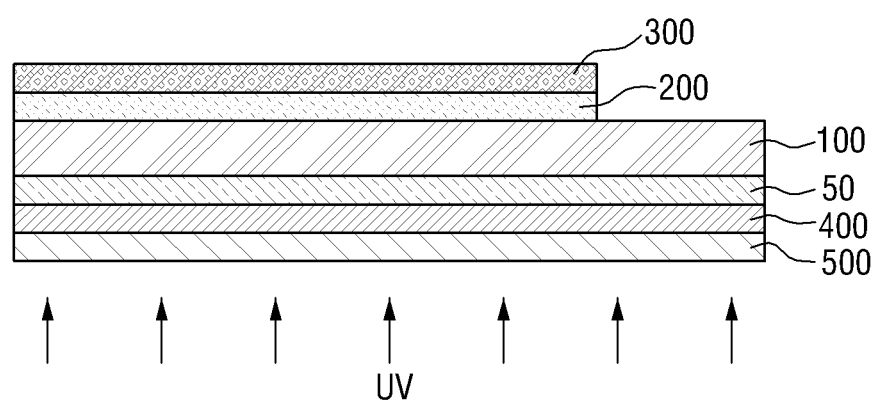

The adhesive layer 400 may include a UV-curable composition, and as shown in FIG. 8, the adhesive layer 400 may be cured through irradiation by UV light. The curing of the adhesive layer may be performed through radiation of UV light from the support layer 500 toward the base substrate 50.

Hereinafter, materials that constitute the adhesive layer 400 will be described in more detail.

The adhesive layer 400 may include an acryl-based compound, a UV-curable compound, and a photoinitiator, and may be cured through irradiation by UV light.

The acryl-based compound may include, for example, buthylacrylate, ethylacrylate, acrylic acid, 2,2'-azobissiobutyronitrile (AIBN), or a mixture thereof.

In an exemplary embodiment, the acryl-based compound may include 30-60 wt % of buthylacrylate, 30 to 60 wt % of ethylacrylate, 0.1-20 wt % of acrylic acid, and 0.1-20 wt % of 2,2'-azobissiobutyronitrile (AIBN).

Further, the UV-curable compound may include aliphatic urethane acrylate, trimethylolpropane triacrylate (TMPTA), 1,6 hexanediol diacrylate (HDDA), or a mixture thereof.

In an exemplary embodiment, the UV-curable compound may include 5-50 wt % of aliphatic urethane acrylate, 5-50 wt % of trimethylolpropane triacrylate (TMPTA), and 5-50 wt % of 1,6 hexanediol diacrylate (HDDA).

In the above-described content range of the acryl-based compound and the UV-curable compound, the storage modulus before the curing of the adhesive layer 400 is low enough to be equal to or lower than $10^3$ Pa, and the storage modulus after the curing of the adhesive layer 400 is in the range of $10^6$ to $10^7$ Pa. Accordingly, the step height of the adhesive layer 400 can be reduced, and thermal deformation or distortion of the adhesive layer 400 can be prevented from occurring when the driving chip is mounted after the curing of the adhesive layer 400, which will be described later. As a result, even if a bump electrode of the driving chip having a micro-pitch is used, it becomes possible to manufacture a display device having superior reliability. Accordingly, a display device having high resolution can be manufactured.

In an exemplary embodiment, the mixing ratio of the acryl-based compound and the UV-curable compound may satisfy the range of 95.5:0.5 to 70:30. In the above-described range, the storage modulus before the curing of the adhesive layer 400 is low enough to be equal to or lower than $10^3$ Pa, and the storage modulus after the curing of the adhesive layer 400 may be in the range of $10^6$ to $10^7$ Pa.

The photoinitiator may include hydroxy dimethyl acetophenone (Micure HP-8), but is not limited thereto. Any photoinitiator that is used in UV-curable resin compositions may be used. In an exemplary embodiment, the photoinitiator may be included in the range of 0.1-5 wt % with respect to the total composition of the adhesive layer 400. If the photoinitiator content is lower than 0.1 wt %, the photoinitiator effect may be insignificant.

On the other hand, in order to further strengthen the heat resistance characteristics, the adhesive layer may further include heat resistant additives. In an exemplary embodiment, the heat resistant additives may include an imide resin such as hexa-fluoro di-methacrylate imide (6FDAI); melamine acrylate-based resin such as melamine tri-acrylate, melamine buta-acrylate, melamine penta-acrylate, or melamine hexa-acrylate; carbon nano tube; graphite; and graphine, but is not limited thereto.

The heat resistant additives may include at least one of silica arogel, phenolic spray foam, urea foam, fiberglass, and polyethylene foam, but is not limited thereto.

The heat resistant additives may be included in the range of 0.1-30 wt % with respect to the total composition of the adhesive layer 400. In the above-described range, the adhesive layer 400 shows superior heat resistance characteristics and satisfies superior storage modulus after the UV curing.

More specifically, the heat resistant additives may include imide resin that includes hexa-fluoro di-methacrylate imide (6FDAI) in the range of 1-30 wt % with respect to the total composition of the adhesive layer 400.

Further, the heat resistant additives may include melamine acrylate-based resin including melamine tri-acrylate, melamine buta-acrylate, melamine penta-acrylate, and/or melamine hexa-acrylate in the range of 1-30 wt % with respect to the total composition of the adhesive layer 400. The above-described melamine tri-acrylate, melamine buta-acrylate, melamine penta-acrylate, and melamine hexa-acrylate may be expressed by chemical formulas 1 to 4 below, respectively.

<Chemical Formula 1>

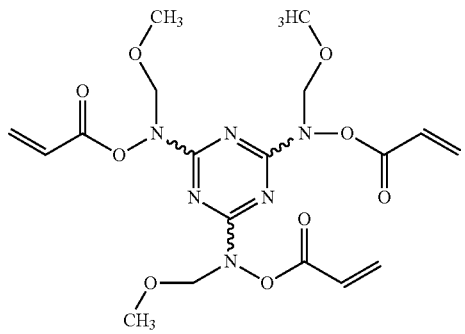

<Chemical Formula 2>

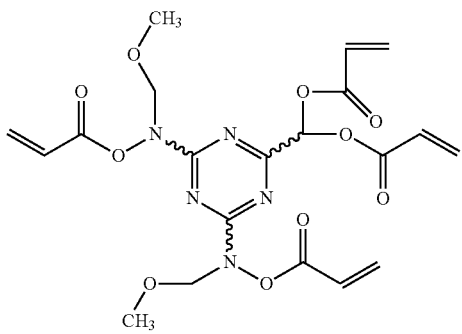

<Chemical Formula 3>

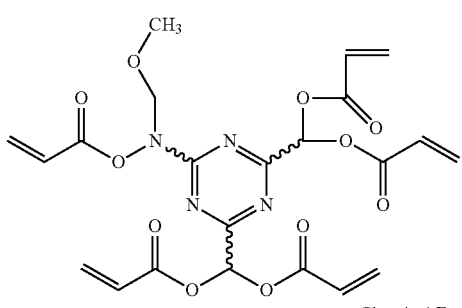

<Chemical Formula 4>

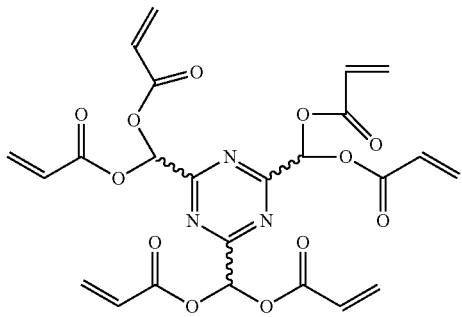

The heat resistant additives may include at least one of carbon nano tube, graphite, and graphine in the range of 0.1-15 wt % with respect to the total composition of the adhesive layer 400.

The heat resistant additives may include at least one of silica arogel, phenolic spray foam, urea foam, fiberglass, and polyethylene foam in the range of 0.1-15 wt % with respect to the total composition of the adhesive layer 400.

Before the UV curing, the materials that constitute the adhesive layer 400 may have low storage modulus with high liquidity, and thus may be uniformly spread on the other surface of the base substrate 50. The storage modulus of the adhesive layer 400 before the UV curing may be, for example, equal to or lower than $10^3$ Pa.

On the other hand, after the UV curing, the storage modulus of the adhesive layer 400 may be in the range of $10^6$ to $10^7$ Pa. The components that constitute the adhesive layer in exemplary embodiments have low storage modulus with high liquidity before the UV curing, and thus the step height of the adhesive layer on the surface on which the adhesive layer is formed can be reduced. Further, the components have high storage modulus after the UV curing with high durability, and thus thermal deformation of the adhesive layer 400 can be prevented from occurring even if the driving chip is directly mounted on the display panel.

Figure 9:
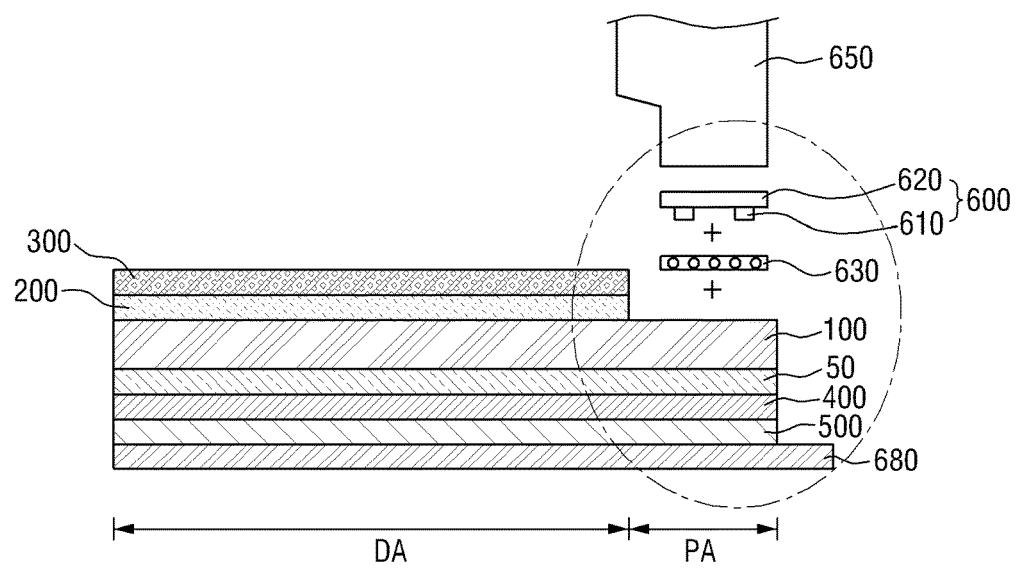

Next, as shown in FIG. 9, the driving chip 600 may be mounted on one surface of the display panel. The driving chip 600 drives the organic light emitting device, and may include a bump electrode 610 for electrical connection with a driving IC (Integrated Circuit) 620 on the display panel.

The display panel may include a display portion DA and a pad portion PA. The driving chip 500 may be mounted on the pad portion PA. The display portion DA is a region in which an image is displayed according to applied signals, and the pad portion PA is a region in which the driving chip 600 is mounted.

According to exemplary embodiments, the driving chip 600 is directly mounted on the display panel, and thus the manufacturing process may be simplified. Due to the high storage modulus after the curing of the adhesive layer 400, the bump electrode 610 of the driving chip 600 can be formed to have a micro-pitch, and thus the thermal deformation of the adhesive layer 400 can be prevented from occurring even if the driving chip 600 is mounted directly on the display panel.

Mounting the driving chip 600 may include seating the prepared display panel on a stage 680, and mounting the driving chip 600 in the pad portion PA through pressing of the driving chip 600 using a pressure head 650. After the pad portion PA of the display panel is put between the stage 680 and the pressure head 650, an anisotropic conductive film 630 may be interposed between the bump electrode 610 of the driving chip 600 and the pad portion PA of the display panel.

Figure 10:
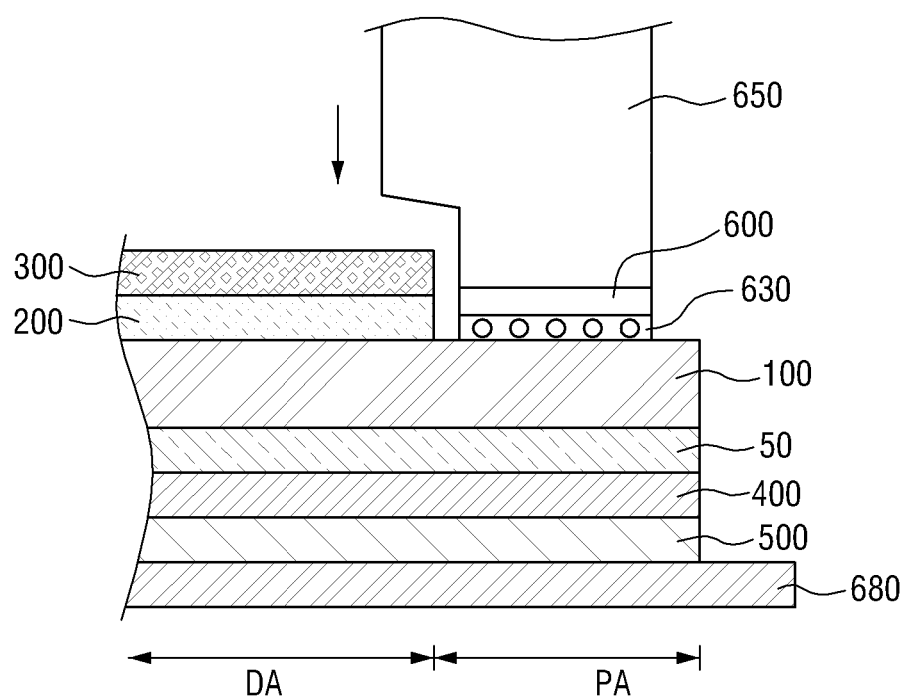

Next, as shown in FIG. 10, the driving chip 600 may be mounted on the pad portion by descending the pressure head 650.

The anisotropic conductive film 630 includes an insulation body and a plurality of conductive particles dispersed in the insulation body to be insulated from each other. Due to the conductive particles, vertical insulation between wirings drawn from the organic light emitting device 100 of the display panel and the bump electrode 610 of the driving chip 600 is broken, and thus, the wirings and the bump electrode 610 are electrically connected to each other.

In a comparative example, when the driving chip 600 is directly mounted on the display panel using the stage 680 and the pressure head 650, the adhesive layer 400 that is positioned between the support layer 500 and the base substrate 50 may be deformed due to generation of heat and pressure. However, in exemplary embodiments of the present inventive concept, since the adhesive layer 400 has a high storage modulus, deformation of the adhesive layer 400 due to the generated heat and pressure can be prevented, and thus, a high-resolution display device can be manufactured.

Figure 11:
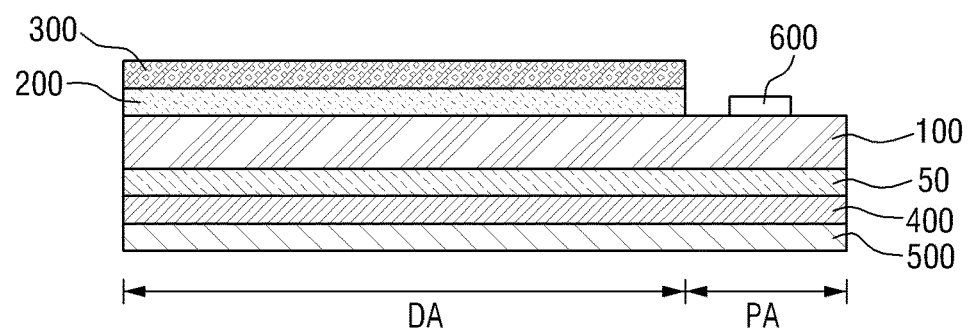

Finally, after the ascending of the pressure head 650, as shown in FIG. 11, the display panel, on which the driving chip 600 is directly mounted, is completed.

Figure 12:
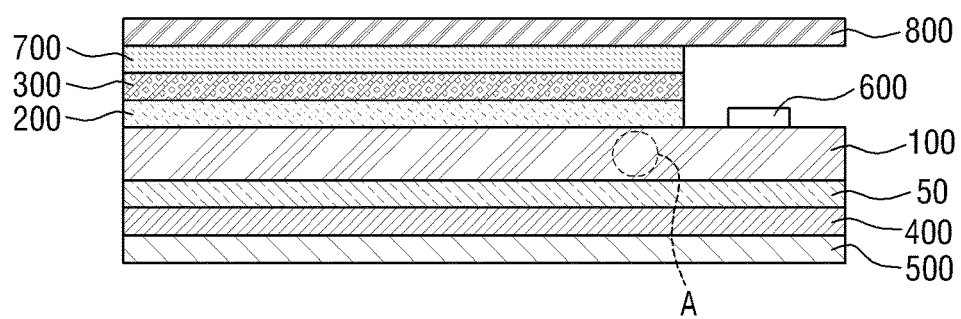

As shown in FIG. 12, a window cover 800 may be attached to an upper portion of the polarizing plate 300 where a touch pad 700 and resin (not illustrated) are interposed between the polarizing plate 300 and the window cover 800. A detailed explanation thereof will be omitted.

According exemplary embodiments, a display device is manufactured by the above-described manufacturing method. Hereinafter, a display device according to an exemplary embodiment of will be described with reference to FIGS. 12 to 14.

Figure 13:
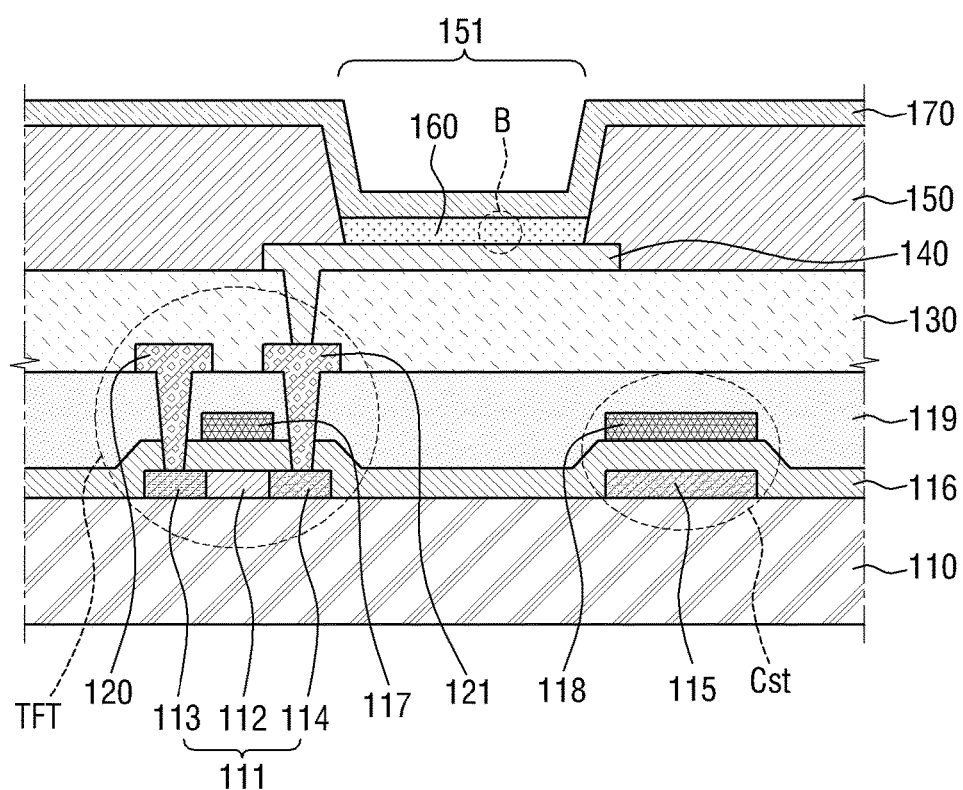
FIG. 13 is an enlarged cross-sectional view of a portion A in FIG. 12.
Figure 14:
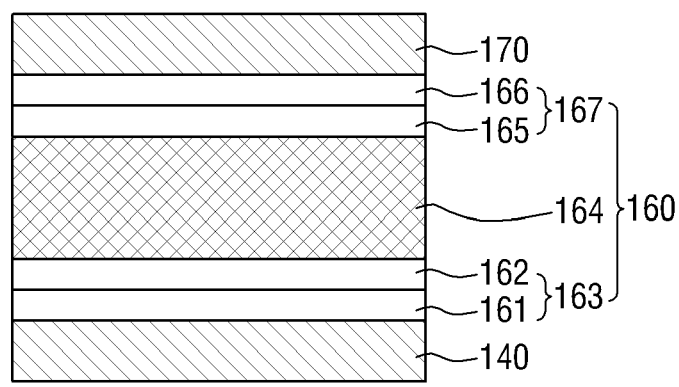
FIG. 14 is an enlarged cross-sectional view of a portion B in FIG. 13.

FIG. 12 is a schematic cross-sectional view of a display panel mounted with a driving chip. FIG. 13 is an enlarged cross-sectional view of an organic light emitting device 100 that corresponds to a portion A in FIG. 12, and FIG. 14 is an enlarged cross-sectional view of a portion B in FIG. 13.

Referring to FIG. 12, the display device may include a base substrate 50, an encapsulation layer 200 facing the base substrate 50, an organic light emitting device 100 interposed between one surface of the base substrate 50 and the encapsulation layer 200, a support layer 500 formed on the other surface of the base substrate 50, an adhesive layer 400 interposed between the base substrate 50 and the support layer 500, and a driving chip 600 mounted on the base substrate 50. Further, the adhesive layer 400 may include an acryl-based compound, a UV-curable compound, and a photoinitiator. Since the materials that constitute the adhesive layer 400 and the driving chip 600 have already been described, the duplicate explanation thereof will be omitted.

Hereinafter, referring to FIG. 13, the organic light emitting device 100 that constitutes the display device will be described.

The organic light emitting device 100 may be divided into a plurality of pixels arranged in rows and columns on the base substrate 50, and may include an active layer 111, a lower electrode 115, a gate insulating layer 116, a gate electrode 117, an upper electrode 118, an interlayer insulating layer 119, a source electrode 120, a drain electrode 121, a planarization pattern 130, a first electrode 140, a pixel defining layer 150, an organic layer 160, and a second electrode 170.

The active layer 111 may be arranged on the base substrate 50, and may include a channel region 112, and a source region 113 and a drain region 114 that are positioned on both sides of the channel region 112. The active layer 111 may be formed of a silicon, such as, for example, amorphous silicon or polysilicon, and the source region 113 and the drain region 114 may be doped with p-type or n-type impurities. The active layer 111 may be formed through a photolithography method, but is not limited thereto.

The lower electrode 115 may be disposed on the same layer as the active layer 111 on the base substrate 50, and may be formed to be spaced apart from the active layer 111. The lower electrode 115 may be formed of the same material as the material of the source region 113 or the drain region 114. That is, the lower electrode 115 may be formed of a silicon, and may include p-type or n-type impurities. The lower electrode 115 may be formed of a photolithography method, but is not limited thereto.

The gate insulating layer 116 is formed on the base substrate 50 to cover the active layer 111 and the lower electrode 115. The gate insulating layer 116 may electrically insulate the gate electrode 117 and the active layer 111 from each other. The gate insulating layer 116 may be made of an insulating material, for example, silicon oxide (SiOx), silicon nitride (SiNx), or metal oxide. The gate insulating layer 116 may be formed through a deposition method, but is not limited thereto.

The gate electrode 117 may be formed on the gate insulating layer 116. The gate electrode 117 may be formed on an upper portion of the channel region 112, i.e., in a position that overlaps the channel region 112 on the gate insulating layer 116. The gate electrode 117 may include, for example, a metal, an alloy, metal nitride, conductive metal oxide, and/or a transparent conductive material. The gate electrode 117 may be formed through a photolithography method, but is not limited thereto.

The upper electrode 118 may be formed on the same layer as the layer of the gate electrode 117, and may be formed of the same material as the material of the gate electrode 117. The upper electrode 118 may be formed on an upper portion of the lower electrode 115, i.e., overlapping the lower electrode 115 on the gate insulating layer 116. The upper electrode 118 as described above may form a storage capacitor Cst together with the lower electrode 115 and the gate insulating layer 116. The storage capacitor Cst may be charged by a voltage that is applied to the gate electrode 117 of a thin film transistor TFT. The upper electrode 117 may be formed through a photolithography method, but is not limited thereto.

The interlayer insulating layer 119 may be formed on the gate insulating layer 116 to cover the gate electrode 117 and the upper electrode 118. The interlayer insulating layer 119 may be made of silicon compounds. For example, the interlayer insulating layer 119 may include silicon oxide, silicon nitride, silicon oxynitride, silicon carbonitride, and silicon oxycarbonate. The interlayer insulating layer 119 may insulate the gate electrode 117 from the source electrode 120 and the drain electrode 121. The interlayer insulating layer 119 may be formed through a deposition method, but is not limited thereto.

The source electrode 120 and the drain electrode 121 may be formed on the interlayer insulating layer 119. The source electrode 120 may penetrate the interlayer insulating layer 119 and the gate insulating layer 116 to be connected to the source region 113 of the active layer 111. The drain electrode 121 may penetrate the interlayer insulating layer 119 and the gate insulating layer 116 to be connected to the drain region 114.

The source electrode 120 and the drain electrode 121 may include at least one of a metal, an alloy, metal nitride, conductive metal oxide, and a transparent conductive material. For example, the source electrode 120 and the drain electrode 121 may be made of at least one of aluminum, an alloy containing aluminum, aluminum nitride, silver, an alloy containing silver, tungsten, tungsten nitride, copper, an alloy containing copper, nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, and indium zinc oxide. The source electrode 120 and the drain electrode 121 may be formed through a photolithography method, but are not limited thereto.

The source electrode 120 and the drain electrode 121 may form a thin film transistor TFT together with the active layer 111 and the gate electrode 117. The thin film transistor TFT may be a driving transistor which supplies current that corresponds to a voltage that is applied to the gate electrode 117 to a light emitting diode (a portion including first electrode 140, organic layer 160, and second electrode 170). Although not separately illustrated, the thin film transistor may be connected to a switching transistor. The switching transistor may apply a voltage corresponding to a data signal that is supplied through a data line (not illustrated) to the thin film transistor TFT in response to a gate signal that is supplied through a gate line (not illustrated).

The planarization pattern 130 may be formed on the interlayer insulating layer 119 to cover the source electrode 120 and the drain electrode 121. The planarization pattern 130 may have a flat surface. The planarization pattern 130 may be arranged in the unit of a pixel. That is, the planarization pattern 130 may overlap a gap region between the planarization patterns 130 that are adjacent to boundary portions of adjacent pixels. Further, the planarization pattern 130 may be integrally formed with the interlayer insulating layer 119.

The first electrode 140 may be formed for each pixel on the base substrate 50. The first electrode 140 may be an anode electrode that receives a signal that is applied to the drain electrode 121 of the thin film transistor TFT and provides holes to the organic layer 160 or a cathode electrode that provides electrons to the organic layer 160. The first electrode 140 may be used as a transparent electrode or a reflective electrode. In the case where the first electrode 140 is a transparent electrode, it may be formed of ITO (Indium Tin Oxide), IZO (Indium Zinc Oxide), ZnO (Zinc Oxide), and/or $In_2O_3$. Further, in the case where the first electrode 140 is a reflective electrode, it may be formed by forming a reflective layer made of Ag, Mg, Al, Pt, Pd, Au, Ni, Nd, Ir, Cr, or a compound thereof and forming ITO, IZO, ZnO, and/or $In_2O_3$ thereon. The first electrode 140 may be formed through a photolithography process, but is not limited thereto.

The pixel defining layer 150 may partition respective pixels on the base substrate 50, and may have an opening 151 that exposes the first electrode 140. Accordingly, the organic layer 160 may be formed on the first electrode 140 through the opening 151. The pixel defining layer 150 may be made of an insulating material. Specifically, the pixel defining layer 150 may include at least one organic material such as benzo cyclo butene (BCB), polyimide (PI), poly amaide (PA), acrylic resin, and phenol resin. Additionally or alternatively, the pixel defining layer 150 may include an inorganic material, such as silicon nitride. The pixel defining layer 150 may be formed through a photolithography process, but is not limited thereto.

The second electrode 170 is formed on the organic layer 160, and may be a cathode electrode that provides electrons to the organic layer 160 or an anode electrode that provides holes to the organic layer 160. In the same manner as the first electrode 110, the second electrode 170 may include a transparent electrode and/or reflective layer. The second electrode may be formed through a deposition process, but is not limited thereto.

FIG. 14 is an enlarged cross-sectional view of a portion B in FIG. 13. Referring to FIG. 14, the organic layer 160 will be described.

The organic layer 160 may include an organic light emitting layer 164, and the organic light emitting layer 164 may be arranged between the first electrode 140 and the second electrode 170. A first charge transfer region 163 may be arranged between the first electrode 140 and the organic light emitting layer 164. Further, a second charge transfer region 167 may be arranged between the organic light emitting layer 164 and the second electrode 170.

One of the first electrode 140 and the second electrode 170 may be an anode electrode, and the other thereof may be a cathode electrode. One of the first charge transfer region 163 and the second charge transfer region 167 may serve to transfer holes, and the other thereof may service to transfer electrons.

In the exemplary embodiment shown in FIG. 14, it is exemplified that the first electrode 140 is an anode electrode, and the second electrode 170 is a cathode electrode. Accordingly, it may be exemplified that the first charge transfer region 163 that is adjacent to the anode electrode is a hole transfer region, and the second charge transfer region 167 that is adjacent to the cathode electrode is an electron transfer region.

The first charge transfer region 163 may be arranged on the first electrode 140. The first charge transfer region 163 may have a single layer structure made of a single material, a single layer structure made of a plurality of different materials, or a multilayer structure having a plurality of layers made of a plurality of different materials. The first charge transfer layer 163 may further include a buffer layer and a first charge blocking layer. In FIG. 14, it is exemplified that the first charge transfer region 163 includes a first charge injection layer 161 and a first charge transport layer 162. However, any one of the first charge injection layer 161 and the first charge transport layer 162 may be omitted, or the charge injection layer 161 and the first charge transport layer 162 may be formed as one layer.

The first charge injection layer 161 is arranged on the first electrode 140 and may heighten a hole injection efficiency from the first electrode 140 to the side of the organic light emitting layer 164. Specifically, the first charge injection layer 161 may make the holes be injected more effectively through lowering of an energy barrier.

The first charge injection layer 161 may include a phthalocyanine compound such as copper phthalocyanine (CuPc), m-MTDATA(4,4',4"-tris(N-3-methylphenyl-N-phenylamino)triphenylamine), TDATA(4,4',4"-tris(diphenylamino)triphenylamine), 2-TNATA(4,4',4"-tris[2-naphthyl(phenyl)-amino]triphenyl-amine), Pani/DBSA (Polyaniline/Dodecylbenzenesulfonic acid), PEDOT/PSS (Poly(3,4-ethylene dioxythiophene)/Polystyrene sulfonate), PANI/CSA (Polyaniline/Camphorsulfonic acid), and/or PANI/PSS (Polyaniline/Polystyrene sulfonate).

The first charge transport layer 162 is arranged on the first charge injection layer 161, and may transport the holes that are injected to the first charge injection layer 161 to the organic light emitting layer 164. The first charge transport layer 162 may have an optimized hole transport efficiency in the case where the highest occupied molecular energy (HOMO) thereof is substantially lower than a work function of a material that forms the first electrode 140 and is substantially higher than the highest occupied molecular energy (HOMO) of the first organic light emitting layer 164. The first charge transport layer 162 may include, for example, NPD(4,4'-bis[N-(1-napthyl)-N-phenyl-amino]biphenyl), TPD(N,N'-diphenyl-N,N'-bis[3-methylphenyl]-1,1'-biphenyl-4,4'-diamine), s-TAD(2,2',7,7'-tetrakis-(N,N-diphenylamino)-9,9'-spirobifluoren), and/or m-MTDATA(4,4',4"-tris(N-3-methylphenyl-N-phenylamino) triphenylamine), but is not limited thereto.

The first charge transfer region 163 may further include a charge generation material to improve conductivity. The charge generation material may be uniformly or non-uniformly dispersed in the first charge transfer region 163. The charge generation material may be, for example, a p-dopant. The p-dopant may be at least one of a quinone derivative, metal oxide, and a cyano-group containing compound, but is not limited thereto. For example, the p-dopant may be a quinone derivative, such as TCNQ(Tetracyanoquinodimethane) or F4-TCNQ(2,3,5,6-tetrafluoro-tetracyanoquinodimethane), or a metal oxide, such as tungsten oxide or molybdenum oxide.

As described above, the first charge transfer region 163 may further include at least one of the buffer layer and the first charge blocking layer. The buffer layer may increase light emission efficiency through compensation of a resonance distance according to the wavelength of light that is emitted from the organic light emitting layer 164. Materials that may be included in the first charge transfer region 163 may be used as materials included in the buffer layer. The first charge blocking layer may serve to prevent charge injection from the second charge transfer region 167 to the first charge transfer region 163.

The organic light emitting layer 164 is arranged on the first charge transfer region 163. Materials of the organic light emitting layer 164 are not specially limited, and materials that are typically used as the light emitting layer may be used. For example, the organic light emitting layer 164 may be made of materials that emit red, green, and blue lights. The organic light emitting layer 164 may include a fluorescent material and/or a phosphorus material.

In an exemplary embodiment, the organic light emitting layer 164 may include a host and a dopant.

As the host, for example, Alq3(tris-(8-hydroyquinolato) aluminum(III)), CBP(4,4'-N,N'-dicarbazole-biphenyl), PVK (poly(N-vinylcarbazole)), ADN(9,10-Bis(2-naphthalenyl) anthracene), TCTA(4,4',4"-tris(Ncarbazolyl)triphenylamine), TPBi(1,3,5-tris(N-phenylbenzimiazole-2-yl)benzene), TBADN(2-(t-butyl)-9, 10-bis (20-naphthyl) anthracene), DSA(distyrylarylene), CDBP(4,4'-Bis(9-carbazolyl)-2,2'-Dimethyl-biphenyl), and/or MADN(2-Methyl-9,10-bis (naphthalen-2-yl)anthracene) may be used.

As the dopant, both a fluorescent dopant and a phosphorus dopant may be used. The kind of dopant may differ depending on the light emission color of the organic light emitting layer 164.

A red dopant may be selected from fluorescent materials that include, for example, PBD:Eu(DBM)3(Phen)(2-biphenyl-4-yl-5-(4-t-butylphenyl)-1,3,4-oxadiazole:Tris(dibenzoylmethane) mono(1,10-phenanthroline)europium(lll)) and Perylene. Further, a phosphorus material may be selected from a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), or PtOEP(octaethylporphyrin platinum), and/or organometallic complex.

A green dopant may be selected from fluorescent materials that include, for example, Alq3(tris-(8-hydroyquinolato) aluminum(III)). Further, as a phosphorus material, Ir(ppy)3(fac tris(-phenylpyridine)iridium), Ir(ppy)2(acac) (Bis(2-phenylpyridine)(acetylacetonate)iridium(III)), and/or Ir(mpyp)3(2-phenyl-4-methyl-pyridine iridium) may be used.

A blue dopant may be selected from fluorescent materials that include, for example, any one selected from the group including spiro-DPVBi(spiro-4,'-bis(2,2'-diphenylvinyl)1, 1'-biphenyl), spiro-6P(spiro-sixphenyl), DSB(distyrylbenzene), DSA(distyrylarylene), PFO(polyfluorene) based polymer, and PPV(poly p-phenylene vinylene)) based polymer. Further, as a phosphorus material, F2Irpic(bis[2-(4,6-difluorophenyl)pyridinato-N,C2']iridium picolinate), (F2ppy)2Ir(tmd)(bis[2-(4,6-difluorophenyl)pyridinato-N, C2']iridium, 2,2,6,6-tetramethylheptane-3,5-dione), or Ir(dfppz)3(tris[1-(4,6-difluorophenyl)pyrazolate-N,C2']iridium) may be used.

The second charge transfer region 167 may be arranged on the organic light emitting layer 164. The second charge transfer region 167 may have a single layer structure made of a single material, a single layer structure made of a plurality of different materials, or a multilayer structure having a plurality of layers made of a plurality of different materials. Further, depending on application, the second charge transfer layer 167 may further include a second charge blocking layer. In the exemplary embodiment shown in FIG. 14, the second charge transfer region 167 includes a second charge transport layer 165 and a second charge injection layer 166. However, any one of the second charge transport layer 165 and the second charge injection layer 166 may be omitted, or the second charge injection transport layer 165 and the second charge injection layer 166 may be formed as one layer.

The second charge transport layer 165 may be arranged on the organic light emitting layer 164 and serve to transport the electrons that are injected from the second charge injection layer 166 to the organic light emitting layer 164.

The second charge transport layer 150 may include Alq3 (tris-(8-hydroyquinolato) aluminum(III)), TPBi(1,3,5-tris (N-phenylbenzimiazole-2-yl)benzene), BCP(2,9-dimethyl-4,7-diphenyl-1,10-phenanthroline), Bphen(4,7-diphenyl-1, 10-phenanthroline), TAZ(3-(Biphenyl-4-yl)-5-(4-tert-butylphenyl)-4-phenyl-4H-1,2,4-triazole), NTAZ(4-(naphthalen-1-yl)-3,5-diphenyl-4H-1,2,4-triazole), tBu-PBD(2-(4-biphenylyl)-5-(4-tert-butyl-phenyl)-1,3,4-oxadiazole), BAlq(Bis(2-methyl-8-quinolinolato-N1,O8)-(1,1'-Biphenyl-4-olato)aluminum), Bebq2(Bis(10-hydroxybenzo[h]quinolinato)beryllium), ADN(9,10-bis(2-naphthyl)anthracene), or a mixture thereof, but is not limited thereto.

The second charge injection layer 166 may be arranged on the second charge transport layer 165 and may heighten the electron injection efficiency from the second electrode 170 to the side of the organic light emitting layer 164.

A lanthanum group metal, such as LiF, LiQ (Lithium Quinolate), Li2O, BaO, NaCl, CsF, or Yb, or (halo)metal, such as RbCl or RbI, may be included in the second charge injection layer 166, but is not limited thereto. The second charge injection layer 166 may be made of a material in which the above-described metal and insulating organo metal salt are mixed. The applied organo metal salt may be a material having an energy band gap of about 4 eV. Specifically, the organo metal salt may include, for example, metal acetate, metal benzoate, metal acetoacetate, metal acetylacetonate, and/or metal stearate.

As described above, the second charge transfer region 167 may further include a second charge blocking layer. The second charge blocking layer may include, for example, at least one of BCP(2,9-dimethyl-4,7-diphenyl-1,10-phenanthroline) and Bphen(4,7-diphenyl-1,10-phenanthroline), but is not limited thereto.

Respective layers that constitute the organic layer 160 may be formed using nozzle printing, inkjet printing, deposition or sputtering. The detailed explanation thereof will be omitted.

According to the method for manufacturing a display device according to exemplary embodiments, a display device having high resolution may be manufactured. During manufacture a display device of such a display device, thermal deformation in the manufacturing process may be reduced.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A method for manufacturing a display device, comprising:
preparing a display panel, the preparation of the display panel comprising:
disposing a base substrate,
disposing an encapsulation layer facing a first surface of the base substrate, and disposing an organic light emitting device between the first surface of the base substrate and the encapsulation layer;

disposing a support layer on a second surface of the base substrate using an adhesive layer, the support layer covering substantially the entire second surface of the base substrate;

curing the adhesive layer using ultraviolet (UV) light irradiation; and mounting a driving chip on one surface of the display panel, wherein:

the adhesive layer comprises an acryl-based compound, a UV curable compound, and a photoinitiator;

the support layer is made of a flexible material;

curing the adhesive layer comprises radiation of UV light from the support layer toward the base substrate; and mounting the driving chip comprises:

seating the display panel on a stage; and mounting the driving chip using a pressure head.

2. The method of claim 1, wherein the acryl-based compound comprises buthylacrylate, ethylacrylate, acrylic acid, 2,2'-azobissiobutyronitrile (AIBN), or a mixture thereof.

3. The method of claim 2, wherein the acryl-based compound comprises 30-60 wt % of buthylacrylate, 30-60 wt % of ethylacrylate, 0.1-20 wt % of acrylic acid, and 0.1-20 wt % of 2,2'-azobissiobutyronitrile (AIBN).

4. The method of claim 1, wherein the UV curable compound comprises aliphatic urethane acrylate, trimethylolpropane triacrylate (TMPTA), 1,6 hexanediol diacrylate (HDDA), or a mixture thereof.

5. The method of claim 4, wherein the UV curable compound comprises 5-50 wt % of aliphatic urethane acrylate, 5-50 wt % of trimethylolpropane triacrylate (TMPTA), and 5-50 wt % of 1,6 hexanediol diacrylate (HDDA).

6. The method of claim 1, wherein a mixing ratio of the acryl-based compound and the UV curable compound is in the range of 95.5:0.5 to 70:30.

7. The method of claim 1, wherein the adhesive layer further comprises heat resistance additives.

8. The method of claim 7, wherein the heat resistance additives comprise at least one selected from the group consisting of hexa-fluoro di-methacrylate imide (6FDAI), melamine tri-acrylate, melamine buta-acrylate, melamine penta-acrylate, melamine hexa-acrylate, carbon nano tube, graphite, and graphine.

9. The method of claim 7, wherein a total composition of the adhesive layer comprises the heat resistance additives in the range of 0.1-30 wt %.

10. The method of claim 1, wherein a top surface of the driving chip is substantially parallel to the first surface of the base substrate.

11. The method of claim 1, wherein:

a storage modulus of the adhesive layer after the curing of the adhesive layer is in the range of $10^6$ to $10^7$ Pa; and a storage modulus of the adhesive layer before the curing of the adhesive layer is less than $10^3$ Pa.

12. The method of claim 1, wherein the base substrate comprises polyimide.

13. The method of claim 1, wherein preparing a display panel further comprises:

portioning the display panel into a display portion and a pad portion, wherein the one surface of the display panel on which the driving chip is mounted is the pad portion.

14. The method of claim 13, wherein mounting the driving chip using the pressure head comprises mounting the driving chip on the pad portion using the pressure head.

15. The method of claim 13, wherein the driving chip is directly mounted on the pad portion.

16. The method of claim 13, further comprising:

disposing an anisotropic conductive film between a bump electrode part of the driving chip and the pad portion.

* * * * *